(12) United States Patent
Hsu

(10) Patent No.: US 7,519,244 B2
(45) Date of Patent: Apr. 14, 2009

(54) CIRCUIT BOARD WITH OPTOELECTRONIC COMPONENT EMBEDDED THEREIN

(75) Inventor: Shih-Ping Hsu, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 2 days.

(21) Appl. No.: 11/487,721

(22) Filed: Jul. 17, 2006

(65) Prior Publication Data

US 2007/0104412 A1  May 10, 2007

(30) Foreign Application Priority Data

Nov. 10, 2005   (TW) ............................... 94139383 A

(51) Int. Cl.
*G02B 6/12* (2006.01)
*G02B 6/26* (2006.01)
*H01S 3/04* (2006.01)

(52) U.S. Cl. ............................. 385/14; 385/31; 385/49; 372/36

(58) Field of Classification Search ....................... None
See application file for complete search history.

(56) References Cited

U.S. PATENT DOCUMENTS 5,745,984 A * 5/1998 Cole et al. ..................... 29/834
6,597,713 B2 * 7/2003 Ouchi .......................... 372/36
6,808,643 B2 * 10/2004 Ho et al. ....................... 216/13
7,112,885 B2 * 9/2006 Chen et al. .................. 257/728
2003/0156402 A1 * 8/2003 Ding et al. ................... 361/820
2005/0087747 A1 * 4/2005 Yamada et al. ................ 257/80

* cited by examiner

*Primary Examiner*—Tina M Wong
(74) *Attorney, Agent, or Firm*—Sawyer Law Group, LLP.

(57) ABSTRACT

A circuit board structure with optoelectronic component embedded therein comprises a carrier board with at least two through openings; a first optoelectronic component and a second optoelectronic component disposed in the openings respectively, wherein a plurality of electrode pads and optical active areas are formed on the active surfaces of the optoelectronic components; a dielectric layer formed on a surface of the carrier board and the active surface of the optoelectronic components, wherein a plurality of vias for exposing the electrode pads and two holes for exposing the optical active areas are formed in the dielectric layer; a circuit layer formed on a surface of the dielectric layer and electrically connected to the electrode pads of the optoelectronic components; an insulating protecting layer formed on the dielectric layer and the circuit layer; and at least one optical transmission element formed on a surface of the insulating protecting layer.

22 Claims, 7 Drawing Sheets

CIRCUIT BOARD WITH OPTOELECTRONIC COMPONENT EMBEDDED THEREIN

CROSS-REFERENCE TO RELATED APPLICATION

This application claims benefit under 35 USC 119 to Taiwan Application No. 094139383, filed Nov. 10, 2005.

FIELD OF THE INVENTION

The present invention relates to an integration of circuit and optoelectronic component structure, and, more particularly, to a circuit with optoelectronic component embedded therein.

BACKGROUND OF THE INVENTION

With the highly increasing development in the electrical industries, the direction of the research and design for the electronic products has gradually shifted to multi-function and high performance. In order to satisfy the packaging requests of integration and miniaturization for the semiconductor packaging, the circuit board that carrying a plurality of the active, non-active components and the circuits has evolved to multi-layer board gradually.

The development of semiconductor technology improves day by day rapidly, besides mainly focusing on the tiny packaging of the model, nowadays the data storage capacity is increasing gradually also. Therefore, with the increasing data amount, the least time taken to process the same amount data shows a higher efficiency in data processing. The straightest way to increase the processing rate of processor is to increase the operating frequency, but facing bottlenecks such as heat dissipation for high power, delay of signal time and electric magnetic interruption (EMI) when the data transmission is above Gb/s, which makes the fabrication of the higher performance semiconductor more difficult. Especially when the copper circuit is conventionally used as a carrier for data transmission, with the natural conductivity limitation of this material, the achieved conductivity cannot be further increased, therefore the signal transmission rate cannot be increased by increasing the conductivity.

In addition, the metallic circuit structure for signal transmission is easy to have interruption form the outside noise or interference form the inner circuit, results in signal transmission error due to the interruption and interference during the signal transmission process; therefore, some protection methods are required for the signal transmission structure to prevent the interruption and interference occur to affect the signal, especially obvious in the high frequency transmission. The protection methods have increased some difficulties and extra structure design for the circuit design, results in increasing in the design cost and the fabrication cost, and therefore, the present condition is hard to make a breakthrough.

Moreover, the conventional signal transmission method is an analogue signal transmission method using electricity flowing through the conductor, but the signal processing methods inside the circuits nowadays mostly are digital processing; therefore a distortion may occur after conversion during the transmission process.

In order to resolve the drawbacks from the conventional analogue signal transmission structure, new technique of transmission method is using the optical signal to replace the electrical signal, and the most obvious improvement is that the optical signal almost will not be interrupted by the electric and magnetic wave; therefore has a better signal transmission quality and reduce the signal transmission distortion. Also the structure design for preventing electric and magnetic wave can be decreased, results in reducing the design and fabrication cost. Thus, using optics as a signal transmission method has become a direction in future development.

Referring to FIG. 1 for the U.S. Pat. No. 6,839,476, showing a saturated layer 12 forming above the bottom layer 11, and a plurality of grooves 12a are formed in the saturated layer 12; then place an optical fiber 13 into the groove 12a, and form another top layer 14 above the saturated layer 12 to embed the optical fiber 13 in the saturated layer 12; thereof the optical fiber 13 is a core 13a covered by a cladding 13b outside. Then the two terminals of the optical fiber 13 can be set up with optical emitter and receiver modules and optical passive components, to transmit optical signal by the optical fiber 13 to avoid the drawbacks from electrical signal transmission.

However, the optical fiber 13 is embedded in the saturated layer 12 and the groove 12a, thus the saturated layer 12 needs to have a grooving fabrication first, then places the optical fiber 13 into the groove 12a. An automatic placing movement, like the conventional insertion movement when inserting electronic components into circuit board, completes the fabrication process of placing the optical fiber 13 into the groove 12a; therefore the speed of the fabrication is slow, and cannot achieve the rapid production purpose.

Moreover, the optical fiber 13 needs to be cut first according to the corresponding groove 12a length, and then places the optical fiber 13 into the groove 12a, which adds another process in the fabrication, therefore increases the fabrication difficulty; and the optical fiber 13 has different lengths, thereof increases the fabrication assorting difficulties, leads to the addition of complexity of the whole fabrication process, and consequently increases the fabrication cost.

At forming the groove 12a on the saturated layer 12 to place the optical fiber 13, the gap between the groove 12a and another groove 12a needs to be relatively spaced in size design, in order to locate the optical fiber 13 into the saturated layer 12; the distance of the gap affects the optical transmission element (such as optical fiber or waveguide) layout density, also the optical transmission element layout density is affected by the size of diameter of the optical fiber 13, thus, cannot achieve the purpose of high density optical transmission element layout.

Beside, the optical fiber 13 used to transmit the optical signal is a core 13a covered by cladding 13b, and the inner layer of the cladding 13b can be used as reflection surface to allow the optical signal reflects forward continuously via the inner layer of the cladding 13b to achieve the signal transmission purpose. The optical fiber 13 and the circuit board have different fabrication structure, thus needs to be fabricated by another independent fabrication process and increases difficulty of the whole fabrication process; and to integrate the two different fabrication products increase difficulty as well, thus cannot achieve the mass production purpose to lower the fabrication cost.

Thus, the increasing fabrication difficulty and cost due to optical fiber 13 has to be embedded in the saturated layer 12, and further, failing to meet the high density optical transmission element layout requirements, has become problems for industries desired to be resolved.

Therefore, to provide an integrated device that can solve problems such as meet the small and lightweight electronic device requirement, lower the signal transmission loss, shorten the conduction path, reduce the noise, and thereby, leads to increase the optoelectronic signal transmission quality, simplify the fabrication process, reduce the fabrication difficulty, increase the optical transmission element layout density, and improve the structure of the mass production circuit board with optoelectronic component embedded therein is a problem desires to be solved in industries.

SUMMARY OF THE INVENTION

In light of the above drawbacks in the prior art, an objective of the present invention is to provide a circuit board with optoelectronic component embedded therein, to fulfill the requirement of a small and lightweight electronic device.

Another objective of the present invention is to provide a circuit board with optoelectronic component embedded therein, to shorten the conduction path to lower the signal transmission loss, and to reduce the noise and increase the optoelectronic signal transmission quality.

A further objective of the present invention is to provide a circuit board with optoelectronic component embedded therein, to increase the optical transmission element layout density.

A further objective of the present invention is to provide a circuit board with optoelectronic component embedded therein, to increase the heat dissipation efficiency of the circuit board.

In accordance with the above and other objectives, the present invention of the circuit board with optoelectronic component embedded therein, comprises: a carrier board with at least two through openings; a first optoelectronic component and a second optoelectronic component disposed in the two openings of the carrier board respectively, wherein both the first and second optoelectronic components have an active surface and an opposing non-active surface, and the active surface of each optoelectronic component has a plurality of electrode pads and optical active areas; a dielectric layer formed on a surface of the carrier board and the active surface of the first and second optoelectronic components, wherein a plurality of vias for exposing the electrode pads of the first and second optoelectronic components and two holes for exposing the optical active areas of the first and second optoelectronic components are formed in the dielectric layer; and a circuit layer formed on a surface of the dielectric layer and electrically connected to the electrode pads of the first and second optoelectronic components through an electrically conductive structure formed in the vias of the dielectric layer.

The optical active areas of the first and second optoelectronic components are formed at a position corresponding to the holes of the dielectric layer, so as to attain an optoelectronic integrated semiconductor component complying with the requirement of a small and lightweight electronic device.

An insulating protecting layer such as a soldermask layer is formed on the surface of the dielectric layer and the circuit layer described above to protect the circuit layer covering underneath. At least one optical transmission element is further formed on the surface of the insulating protecting layer, wherein at least one terminal of the optical transmission element is placed at the top of one of the holes of the dielectric layer and the terminal of the optical transmission element has at least one optical reflection surface. Furthermore, a metallic case or an encapsulant is formed on a surface of the soldermask layer and a surface of the optical transmission element. Therefore, signals of the first and second optoelectronic components can be transmitted by the optical transmission element to reduce the signal transmitting loss and the noise interruption, so as to improve the transmission quality of optoelectronic signal.

In other exemplary preferred embodiment, a circuit build-up structure electrically connecting to the circuit layer is further formed on the surface of the circuit layer and the surface of the dielectric layer, wherein the circuit build-up structure is formed with holes at a position corresponding to the optical active areas of the first and second optoelectronic components to expose the optical active areas of the first and second optoelectronic components. In addition, an insulating protecting layer is formed on an outer of the circuit build-up structure, and at least one optical transmission element is formed on the surface of the soldermask layer, wherein at least one terminal of the optical transmission element is placed at the top of one of the holes of the insulating protecting layer and the terminal of the optical transmission element has at least one optical reflection surface. Thus, the optical active areas of the first and second optoelectronic components can correspond to the optical reflection surface of the optical transmission element, so as to transmit signals.

Beside, at least one optical transmission element is formed directly on the surface of the circuit layer of the present invention, therefore forming an extra groove to dispose the optical transmission element is not necessary, which leads to a simplified fabrication process, thereby reduces the fabrication difficulty and also increases the optical transmission element layout density.

Additionally, the present invention of the circuit board with optoelectronic component embedded therein, can further process a circuit build-up fabrication to form a circuit build-up structure on the dielectric layer and the circuit layer according to the real electrical design needs, to satisfy the continuous improvement demands for the electronic products.

Moreover, a heatsink board is further formed on a bottom surface of the carrier board or a heatsink block is formed on the non-active surface of the optoelectronic component, in order to diffuse the heat generated by the first and second optoelectronic components during operation to the outer environment efficiently, thereby strengthen the heat dissipation efficiency of the present invention of the circuit board with optoelectronic component embedded therein.

DETAILED DESCRIPTION OF THE PERFERRED EMBODIMENTS

The main character of the present invention is to dispose a plurality of optoelectronic components in the opening of the carrier board, then the carrier board and the active surface of the optoelectronic components form the dielectric layer, the circuit layer, to form a circuit board with optoelectronic component embedded therein. The carrier board described above could be metal board, ceramic board or insulating board, and also could be an organic circuit board with double layer or multi-layer circuit. In order to simplify the diagram and description, please note that the description below uses metal board, ceramic board or insulating board as the carrier board for examples, but not to limit the present invention in this scope.

First Embodiment

Figure 1:
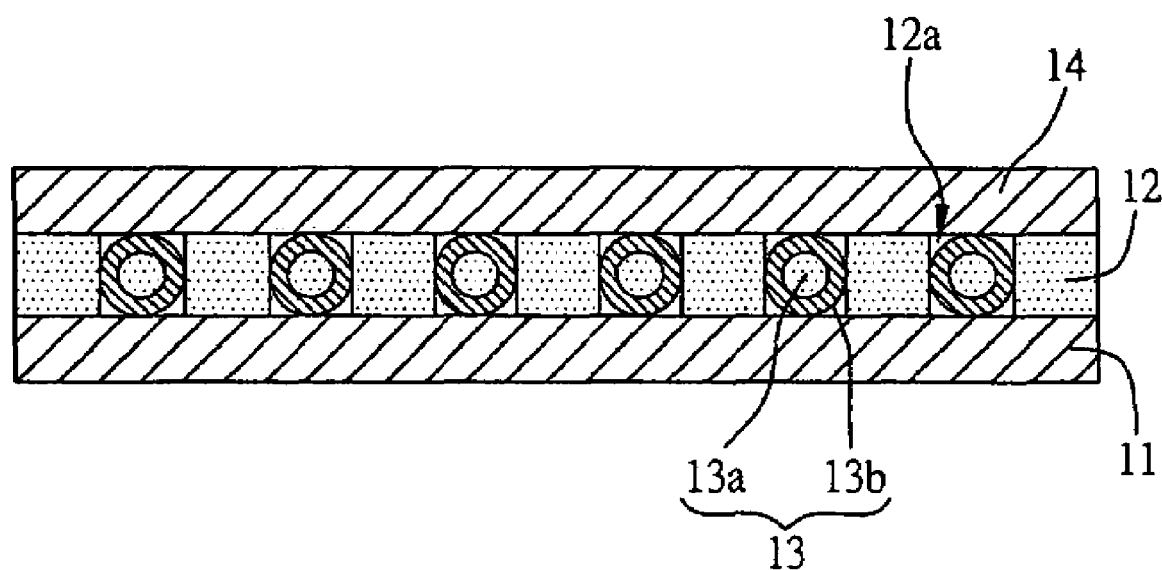
FIG. 1 is a cross-sectional diagram of the U.S. Pat. No. 6,839,476.
Figure 2A:
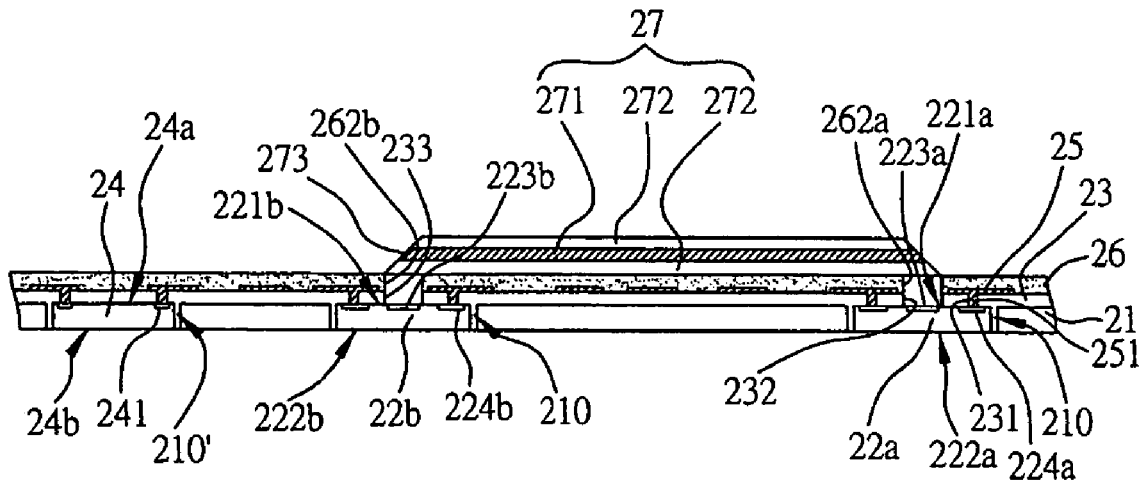
FIG. 2A is a cross-sectional diagram illustrating the first embodiment of the present invention of the circuit board with optoelectronic component embedded therein.

Referring to FIG. 2A, which is a cross-sectional diagram, illustrating the first embodiment of the present invention of the circuit board with optoelectronic component embedded therein, comprises: a carrier board 21 with at least two through openings 210, and the first and second optoelectronic components 22a, 22b are disposed in the openings 210 respectively; an dielectric layer 23 formed on the surface of the carrier board 21, the first and second optoelectronic components 22a, 22b; and a circuit layer 25 formed on the surface of the dielectric layer 23.

The carrier board 21 could be metal board, ceramic board, insulating board and organic circuit board, or any board mentioned here forming a stack structure freely; therein the organic circuit board is printed circuit board or IC packaging substrate. The use of metal board or ceramic board can be used as a heatsink for the first and second optoelectronic components 22a, 22b, or using the organic circuit board as the carrier board 21 can increase the electrical performance.

The first and second optoelectronic components 22a, 22b have active surfaces 221a, 221b and non-active surfaces 222a, 222b opposite to the active surfaces 221a, 221b respectively, and the active surfaces 221a, 221b have optical active areas 223a, 223b and a plurality of electrode pads 224a, 224b. The first and second optoelectronic components 22a, 22b could be an optical active component or an optical passive component, therein the optical active component includes laser diode (LD), light emitting diode (LED), or vertical cavity surface emitting laser (VCSEL), and the optical passive component includes photo diode or photo sensing component.

The dielectric layer 23 uses photosensitive resin or non-photosensitive such as ABF (Ajinomoto Build-up Film), BCB (Benzocyclo-Buthene), LCP (Liquid Crystal Polymer), PI (Poly-imide), PPE (Poly(phenylene ether)), PTFE (Poly (tetra-fluoroethylene)), FR4, FR5, BT (Bismaleimide Triazine) and Aramide, or a mixture of material PI and glass fiber; the dielectric layer 23 forms a plurality of vias 231 to expose the electrode pads 224a, 224b of the first and second optoelectronic components 22a, 22b and holes 232, 233 to expose the optical active areas 223a, 223b of the first and second optoelectronic components 22a, 22b.

The circuit layer 25 is formed on the surface of the dielectric layer 23 and electrically connected to the electrode pads 224a, 224b of the first and second optoelectronic components 22a, 22b through the electrically conductive structure 251 formed in the via 231 of the dielectric layer 23.

At least one semiconductor component 24 is further formed at another opening 210' of the carrier board 21, and the semiconductor component 24 has an active surfaces 24a and a non-active surfaces 24b opposites to the active surface 24a, and the active surfaces 24a has a plurality of electrode pads 241, and the electrically conductive structure 251 of the circuit layer 25 is electrically connected to the electrode pads 241 of the semiconductor component 24.

Beside, an insulating protecting layer 26 is further formed on the surface of the dielectric later 23 and the circuit layer 25, to protect the circuit layer 25 covering underneath, and forms holes 262a, 262b to expose the optical active areas 223a, 223b of the first and second optoelectronic components 22a, 22b.

Furthermore, an optical transmission element 27 such as an optical waveguide is formed on the surface of the insulating protecting layer 26, and comprises a core layer 271 and a cladding layer 272 forming on the surface of the core layer 271, wherein the refraction rate of the optical signal in the core layer 271 is larger than in the cladding layer 272; at least one terminal of the optical transmission element 27 has a reflection surface 273 used to reflect the transmitted optical signal, and the reflection surface 273 is at the top of the hole 232 or 233, preferably, the reflection surface is at 45° to allow the optical signal traveling through the core layer 271 directly during transmission, avoiding several extra reflections between the core layer 271 and the cladding layer 272 boundary, which causes increasing in transmission distance and optical loss. At the present embodiment, the two terminals of the optical transmission element 27 both have a reflection surface 273 with 45°, where the two reflection surfaces are at the top of the two holes 232, 233, and opposite to the optical active areas 223a, 223b of the first and second optoelectronic components 22a, 22b respectively, to enable the optical transmission between the first and second optoelectronic components 22a, 22b. Because the first and second optoelectronic components transmit and receive the optical signal directly via the optical transmission element 27, which leads to shorten the transmission path, thereby reduces the signal loss during transmission and improves the transmission quality.

Additionally, the holes 232, 233 penetrating through the dielectric layer 23 and the holes 262a, 262b penetrating through the insulating protecting layer 26 could be filled up with light guiding material (not shown in the diagram) or extracted to vacuum to reduce the interference from the outside noise to improve the efficiency of the optical transmission.

Second Embodiment

Figure 2B:
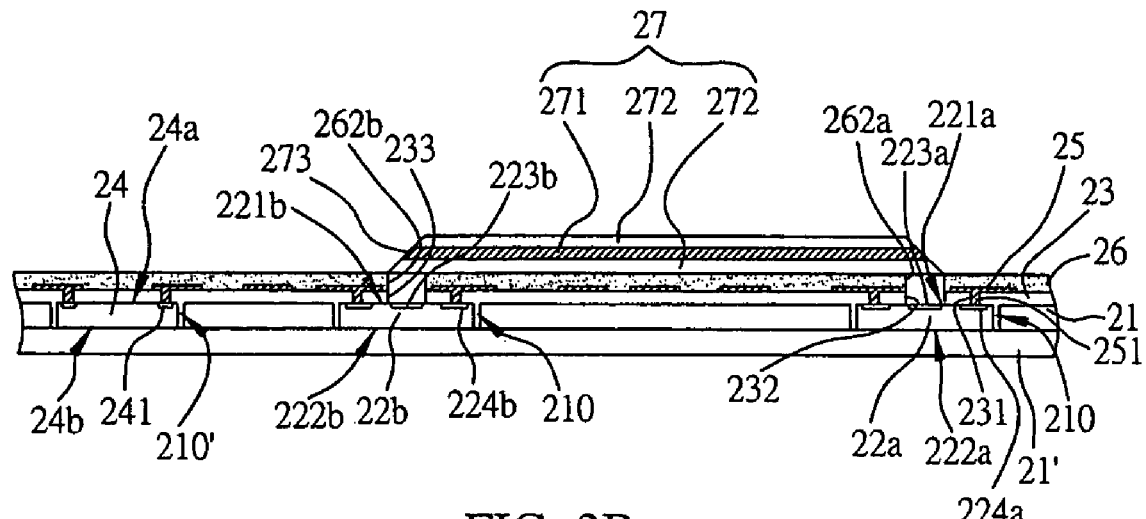
FIG. 2B is a cross-sectional diagram illustrating the second embodiment of the present invention of the circuit board with optoelectronic component embedded therein.

Referring to FIG. 2B, which is a cross-sectional diagram, illustrating the second embodiment of the present invention of the circuit board with optoelectronic component embedded therein, has a difference comparing to the previous embodiment. Another carrier board 21' is attached to the bottom surface of the carrier board 21, and the carrier board 21' could be metal board, ceramic board, insulating board and organic circuit board, or any board mentioned here forming a stack structure freely; therein the organic circuit board is printed circuit board or IC packaging substrate; and if the carrier board 21' is made form metal board or ceramic board, the heat generated by the first and second optoelectronic components 22a, 22b and the semiconductor component 24 during operation can be diffused effectively, which strengthen the heat dissipation efficiency of the circuit board with optoelectronic component embedded therein.

Figure 2C:
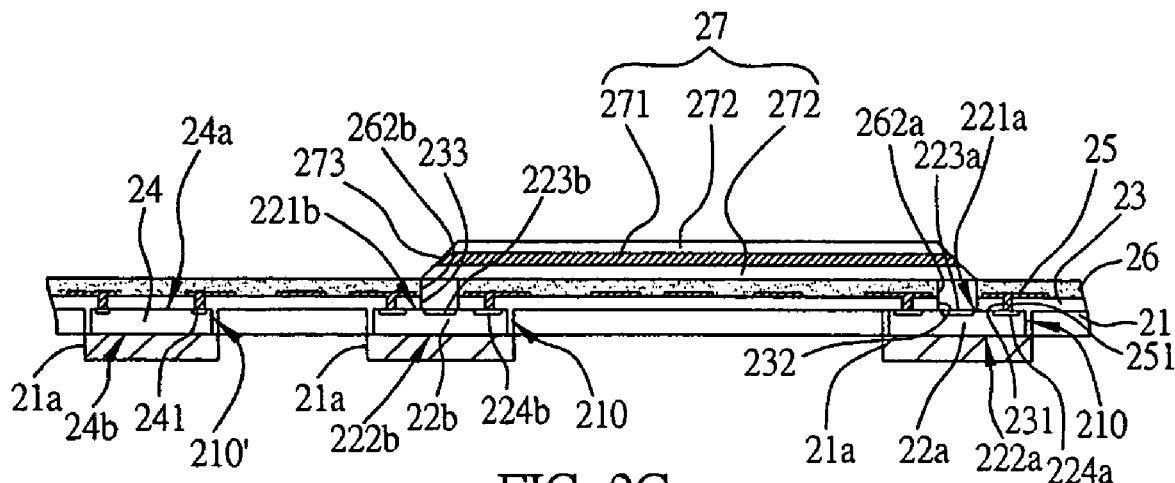
FIG. 2C is another cross-sectional diagram illustrating the second embodiment of the present invention of the circuit board with optoelectronic component embedded therein.

Referring to FIG. 2C, a heatsink block 21a is disposed on the non-active surfaces 222a, 222b of the first and second optoelectronic components 22a, 22b at the opening 21 of the carrier board 21, and the non-active surface 24b of the semiconductor component 24 to diffuse the heat.

Third Embodiment

Figure 2D:
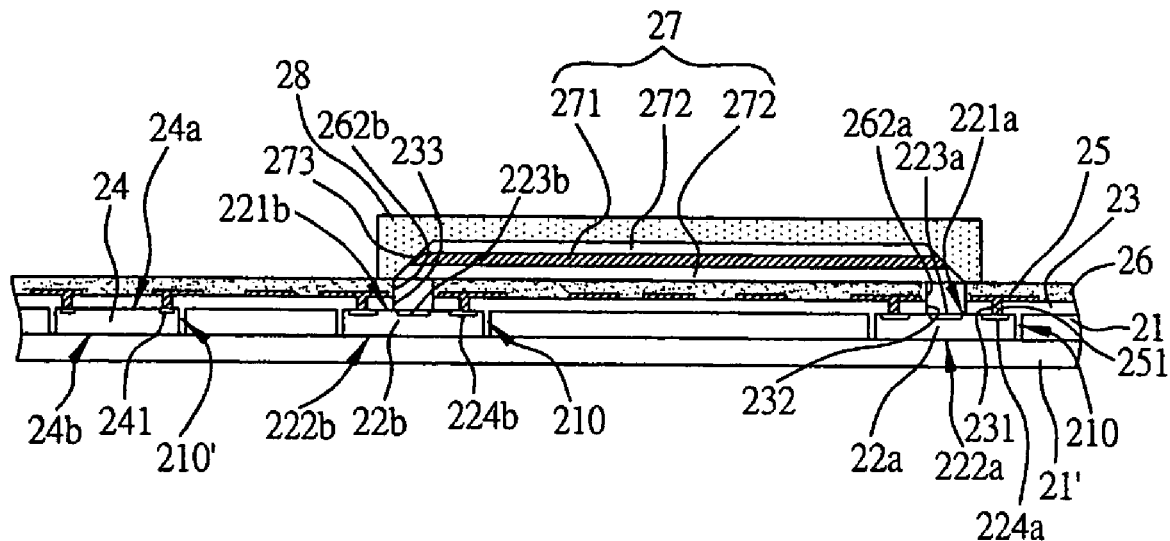
FIG. 2D is a cross-sectional diagram illustrating the third embodiment of the present invention of the circuit board with optoelectronic component embedded therein.

Referring to FIG. 2D, a cross-sectional diagram illustrating the third embodiment of the present invention of the circuit board with optoelectronic component embedded therein, has a difference comparing to the previous embodiment, where a protecting shield such as an encapsulant 28 is formed on the optical transmission element 27 and the insulating protecting layer 26, to protect the optical transmission element 27 from damage by the outside influence, thereby increases the lifetime of the product.

Figure 2E:
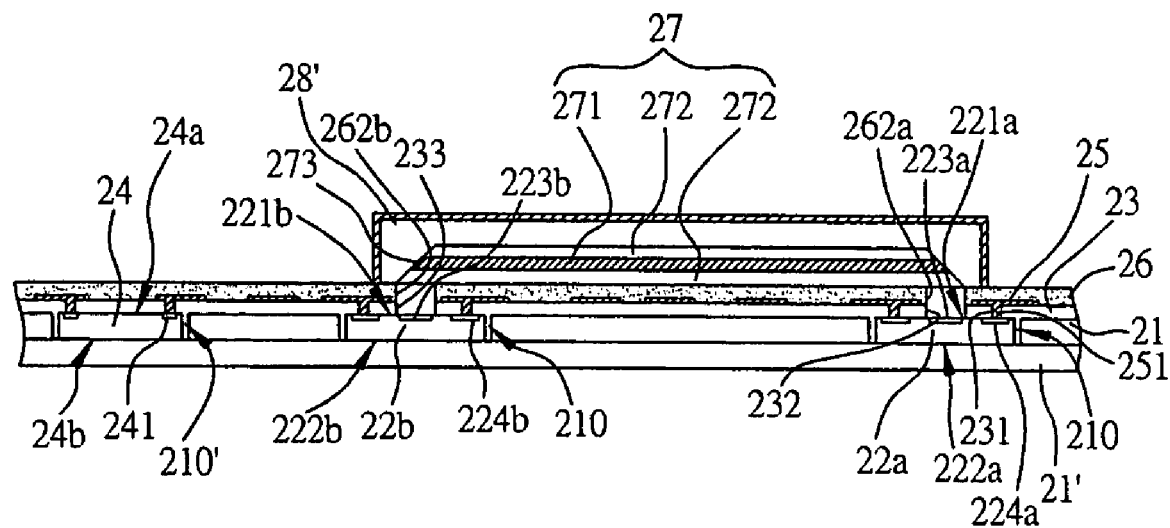
FIG. 2E is another cross-sectional diagram illustrating the third embodiment of the present invention of the circuit board with optoelectronic component embedded therein.

Referring to FIG. 2E illustrating another embodiment of the optical transmission element protection of the present invention, where a protecting shield such as metallic case 28' is formed on the optical transmission element 27 and the insulating protecting layer 26, to protect the optical transmission element 27.

Fourth Embodiment

Figure 3A:
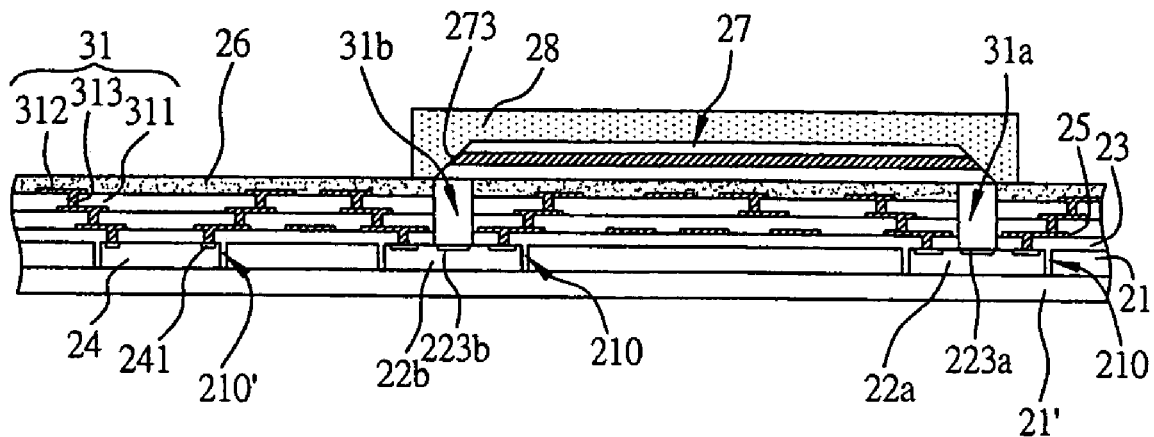
FIG. 3A is a cross-sectional diagram illustrating the fourth embodiment of the present invention of the circuit board with optoelectronic component embedded therein.

As shown in FIG. 3A, which is a schematic diagram of the fourth embodiment of the present invention of the circuit board with optoelectronic component embedded therein.

The present embodiment of the circuit board with optoelectronic component embedded therein is roughly the same with the first embodiment, only the present embodiment further includes a circuit build-up structure. As shown in the diagram, at the present embodiment, a circuit build-up structure 31 is formed on the dielectric layer 23 and the circuit layer 25 by processing a circuit build fabrication, and the circuit build-up structure is electrically connected to the circuit layer 25.

The circuit build-up structure 31 comprises at least: at least one dielectric layer 311, a circuit layer 312 lying above the dielectric layer 311, and an electrically conductive structure 313 forming in the dielectric layer 311; the electrically conductive structure 313 is a conductive via, then the electrically conductive structure 313 is electrically connected to the circuit layer 25 and forms holes 31a, 31b in the circuit build-up structure 31 where corresponding to the optical active areas 223a, 223b of the first and second optoelectronic components 22a, 22b to expose the optical active areas 223a, 223b of the first and second optoelectronic components 22a, 22b respectively.

Beside, at the present embodiment, an insulating protecting layer 26, an optical transmission element 27 and an encapsulant 28 are formed on the circuit build-up structure 31. The insulating protecting layer 26 is formed on the outer surface of the circuit build-up structure 31 to protect the circuit layer on the outer surface of the circuit build-up structure 31; the optical transmission element 27 is formed on the surface of the insulating protecting layer 26, and the two terminals of the optical transmission element 27 are at the top of the holes 262a, 262b of the insulating protecting layer 26 and at the top of the holes 31a, 31b of the circuit build-up structure 31 respectively, and let the reflection surfaces 273 of the two terminals opposite to the optical active areas 223a, 223b of the first and second optoelectronic components respectively, to enable the first and second optoelectronic components 22a, 22b to transmit and receive the signal directly through the optical transmission element 27.

Additionally, the holes 31a, 31b of the circuit build-up structure 31 and the holes 262a, 262b of the insulating protecting layer 26 could be filled up with light guiding material or extracted to vacuum.

Also, at least one semiconductor component 24 is disposed at the opening 210' of the carrier board 21, and the semiconductor component 24 has a plurality of electrode pads 241 and the electrode pads 241 of the semiconductor component 24 is electrically connected to the electrically conductive structure 251 of the circuit layer 25, to let the semiconductor component 24 able to electrically connect to the circuit build-up structure 31.

Another carrier board 21' is attached to the bottom surface of the carrier board 21, and the carrier board 21' could be metal board, ceramic board, insulating board and organic circuit board, or any board mentioned here forming a stack structure freely; therein the organic circuit board is printed circuit board or IC packaging substrate.

Figure 3B:
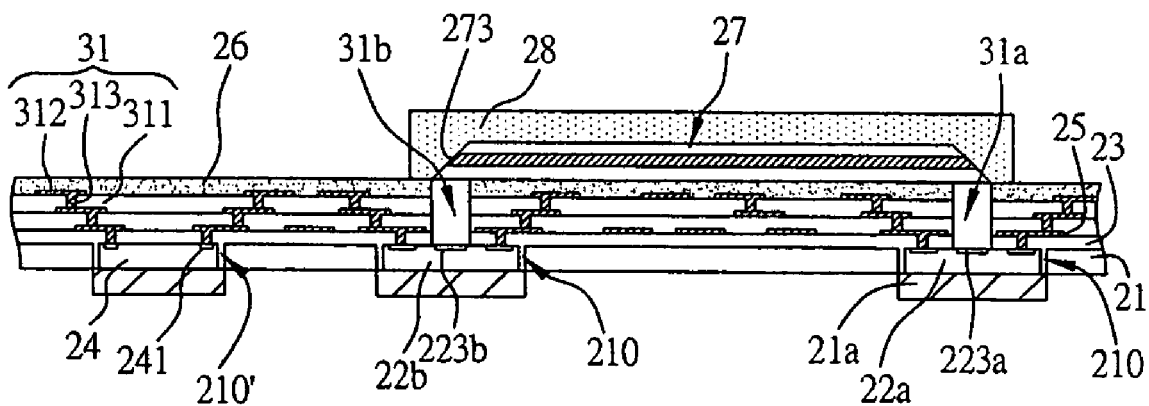
FIG. 3B is another cross-sectional diagram illustrating the fourth embodiment of the present invention of the circuit board with optoelectronic component embedded therein.

Referring to FIG. 3B, a heatsink block 21a could be disposed on the non-active surfaces of the first and second optoelectronic components 22a, 22b and of the semiconductor component 24, to diffuse heat. Through the metal board or the heatsink block to diffuse the heat generated by the first and second optoelectronic components 22a, 22b and the semiconductor component 24 during operation effectively, thereby strengthens the heat dissipation efficiency of the present invention of the circuit board with optoelectronic component embedded therein.

Fifth Embodiment

Figure 4A:
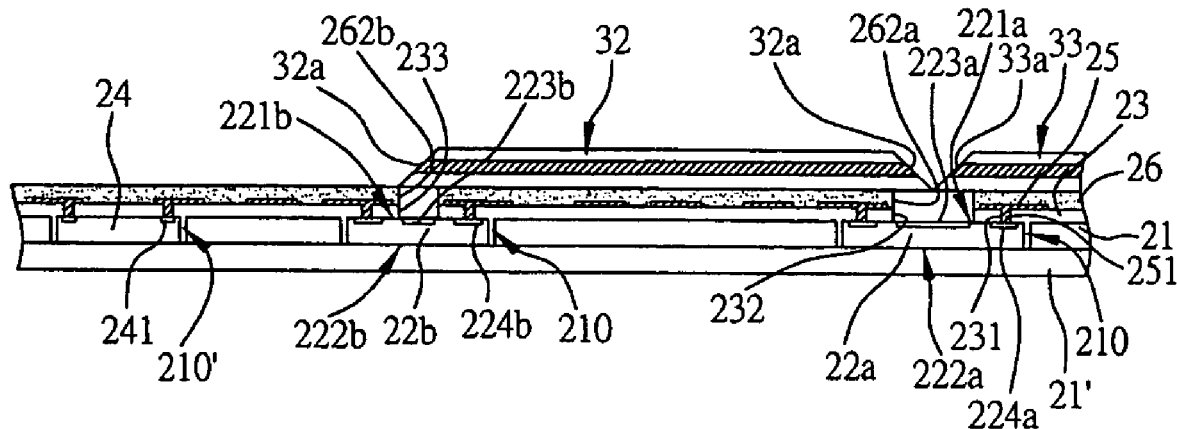
FIG. 4A is a cross-sectional diagram illustrating the fifth embodiment of the present invention of the circuit board with optoelectronic component embedded therein.

As shown in FIG. 4A, which is a schematic diagram of the fifth embodiment of the present invention of the circuit board with optoelectronic component embedded therein.

The present embodiment of the circuit board with optoelectronic component embedded therein is roughly the same with the first embodiment, the difference is a plurality of optical transmission elements 32, 33 are formed on the surface of the insulating protecting layer 26, and at least one terminal of the optical transmission element 32, 33 has a reflection surface 32a, 33a.

The reflection surface 32a at the terminal of the optical transmission element 32 is at the top of the hole 233 and completely blocks the hole 233 of the dielectric layer 23 and the hole 262b of the insulating protecting layer 26, and opposites to the optical active area 223b of the second optoelectronic component 22b; the reflection surface 32a at the other terminal of the optical transmission element 32 and the reflection surface 33a of another optical transmission element 33 are both at the top of the hole 232 of the dielectric layer 23 and the hole 262b of the insulating protecting layer 26, and opposite to the optical active area 223a of the first optoelectronic component 22a. Therefore, the first optoelectronic component 22a faces two reflection surfaces 32a, 33a simultaneously, results in receiving optical signal or transmitting optical signal from and to the optical transmission elements 32, 33 at the same time. Thereby, achieve the signal transmission between multi-terminals and increase the signal transmission and processing ability.

At least one semiconductor component 24 is further disposed at another opening 210' of the carrier board 21, and the semiconductor component 24 has a plurality of electrode pads 241 and the electrode pads 241 of the semiconductor component 24 is electrically connected to the electrically conductive structure 251 of the circuit layer 25.

Another carrier board 21' is further attached to the bottom surface of the carrier board 21, and the carrier board 21' could be metal board, ceramic board, insulating board and organic circuit board, or any board mentioned here forming a stack structure freely; therein the organic circuit board is printed circuit board or IC packaging substrate.

Figure 4B:
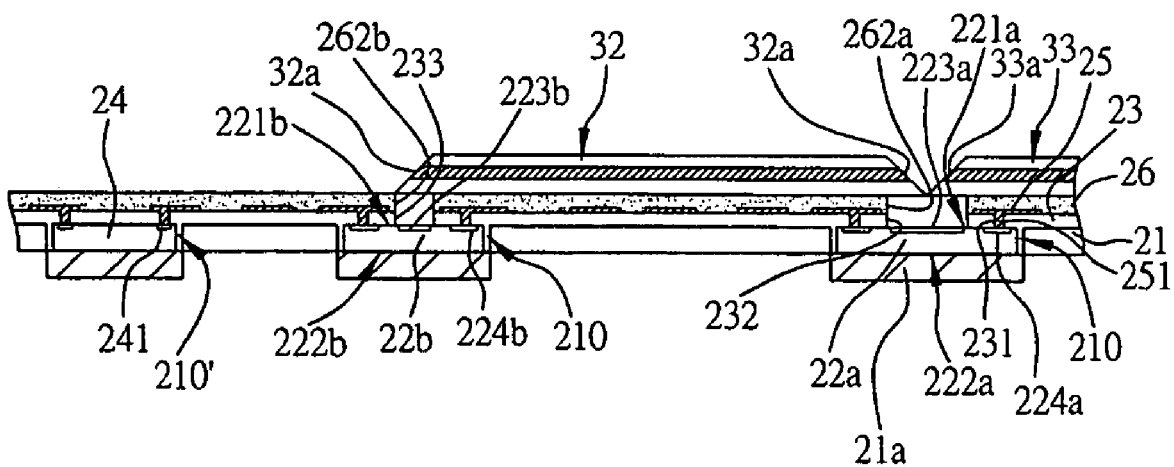
FIG. 4B is another cross-sectional diagram illustrating the fifth embodiment of the present invention of the circuit board with optoelectronic component embedded therein.

Referring to FIG. 4B, a heatsink block 21a could be disposed on the non-active surfaces of the optoelectronic components and the semiconductor to diffuse heat, thereby strengthens the heat dissipation efficiency of the present invention of the circuit board with optoelectronic component embedded therein.

Sixth Embodiment

Figure 5A:
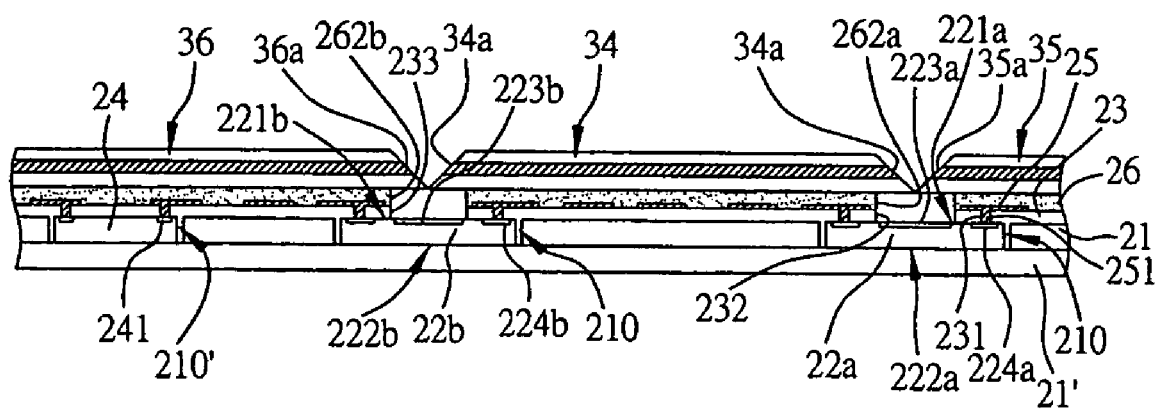
FIG. 5A is a cross-sectional diagram illustrating the sixth embodiment of the present invention of the circuit board with optoelectronic component embedded therein.

As shown in FIG. 5A, which is a schematic diagram of the sixth embodiment of the present invention of the circuit board with optoelectronic component embedded therein.

The present embodiment of the circuit board with optoelectronic component embedded therein is roughly the same with the previous embodiment, the difference is a plurality of optical transmission elements 34, 35, and 36 are formed on the surface of the insulating protecting layer 26, and at least one terminal of the optical transmission element 34, 35, and 36 has a reflection surface 34a, 35a, and 36a.

The reflection surfaces 34a, 35a at the terminal of the optical transmission elements 34, 35 are opposite to the optical active area 223a of the first optoelectronic component 22a, and the reflection surface 34a at the other terminal of the optical transmission element 34 and the reflection surface 36a of another optical transmission element 36 are both opposite to the to the optical active area 223b of the second optoelectronic component 22b, to enable the first and second optoelectronic components 22a, 22b transmitting to each other via the optical transmission element 34, and further the first and second optoelectronic components could also transmit signal with other optoelectronic components through the optical transmission elements 35, 36 respectively, results in the increasing electrical performance of the circuit board.

At least one semiconductor component 24 is further disposed at another opening 210' of the carrier board 21, and the semiconductor component 24 has a plurality of electrode pads 241 and the electrode pads 241 of the semiconductor component 24 is electrically connected to the electrically conductive structure 251 of the circuit layer 25.

Another carrier board 21' is further attached to the bottom surface of the carrier board 21, and the carrier board 21' could be metal board, ceramic board, insulating board and organic circuit board, or any board mentioned here forming a stack structure freely; therein the organic circuit board is printed circuit board or IC packaging substrate.

Figure 5B:
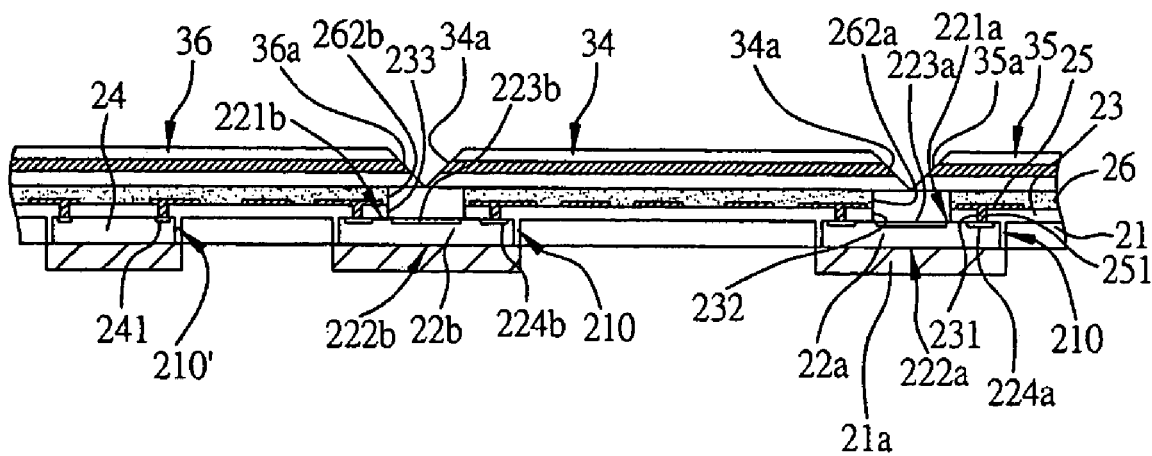
FIG. 5B is another cross-sectional diagram illustrating the sixth embodiment of the present invention of the circuit board with optoelectronic component embedded therein.

Referring to FIG. 5B, a heatsink block 21a could be disposed on the non-active surfaces of the optoelectronic components and the semiconductor component to diffuse heat, thereby strengthens the heat dissipation efficiency of the present invention of the circuit board with optoelectronic component embedded therein.

Therefore, the present invention of the circuit board with optoelectronic component embedded therein, mainly comprises the first and second optoelectronic components disposed in the openings of the carrier board, and the active surfaces of the first and second optoelectronic components have a plurality of electrode pads and optical active areas; the dielectric layer is formed on the surface of the carrier board and the optical active areas of the first and second optoelectronic components, and two holes are formed in the dielectric layer to expose the optical active areas of the first and second optoelectronic components; and the circuit layer is formed on the surface of the dielectric layer and electrically connected to the electrode pads of the first and second optoelectronic components.

Seventh Embodiment

Figure 6:
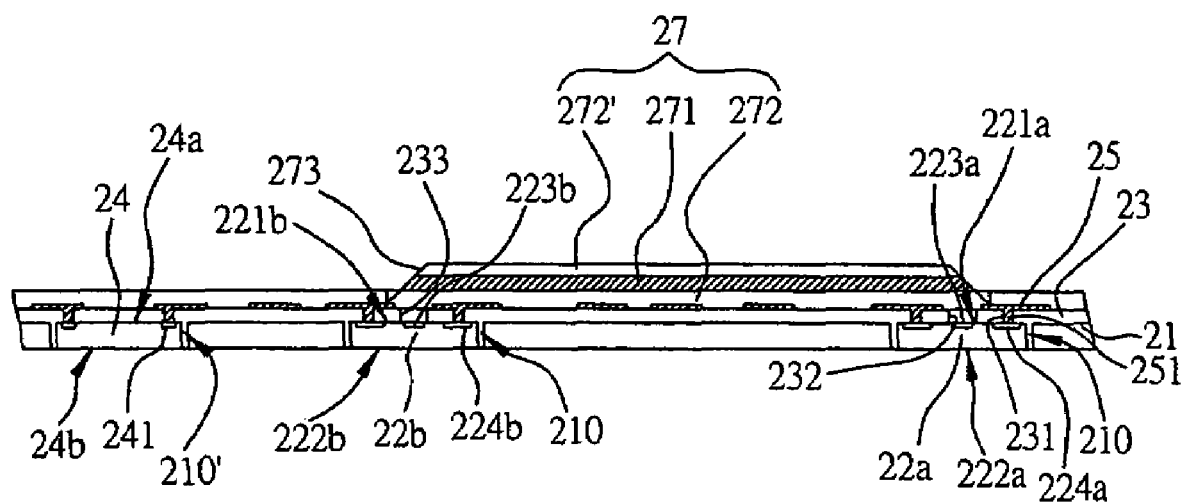
FIG. 6 is a cross-sectional diagram illustrating the seventh embodiment of the present invention of the circuit board with optoelectronic component embedded therein.

As shown in FIG. 6, which is a schematic diagram of the seventh embodiment of the present invention of the circuit board with optoelectronic component embedded therein. The present embodiment of the circuit board with optoelectronic component embedded therein is roughly the same with the previous embodiment, the difference is a cladding layer of the optical transmission element is formed on the surface of the dielectric layer and the circuit layer to replace the insulating protecting layer in those previously described embodiments.

As shown in FIG. 6, a cladding layer 272 of the optical transmission element 27 is formed on the surface of the dielectric layer 23 and the circuit layer 25 to protect the circuit layer 25 on the surface of the dielectric layer 23; a core layer 271 of the optical transmission element 27 is formed on the cladding layer 272 and the two terminals of the core layer 271 form a reflection surface 273, the reflection surface 273 of the optical transmission element 27 is at the top of the holes 232, 233 of the dielectric layer 23, opposite to the optical active areas 223a, 223b of the first and second optoelectronic components 22a, 22b; and another cladding layer 272' is formed on the surface of the core layer 271.

The holes 232, 233 penetrating through the dielectric layer 23 could be filled up with light guiding material (not shown in the diagram) or extracted to vacuum to reduce the interference from the outside noise.

Beside, the circuit layer surface of the present invention could form an insulating protecting layer and at least one optical transmission element and does not need to form an extra groove to dispose the optical transmission element in the optoelectronic component integrated semiconductor component fabrication, therefore simplifies the fabrication process, reduces the fabrication difficulty and also increases the optical transmission element layout density.

Additionally, the present invention of the circuit board with optoelectronic component embedded therein, could further process a circuit build-up fabrication to form a circuit build-up structure on the dielectric layer and the circuit layer according to the real electrical design needs, to satisfy the continuous improvement demands for the electronic products.

Moreover, a heatsink board is further formed on the bottom surface of the carrier board or a heatsink block is formed on the non-active surface of the component, in order to diffuse the heat generated by the first and second optoelectronic components and the semiconductor component during the operation efficiently, thereby strengthen the heat dissipation efficiency of the present invention of the circuit board with optoelectronic component embedded therein; or form an insulating board as the first layer to carry components during fabrication; or form an organic circuit board to increase the electrical function.

The present invention has been described using exemplary preferred embodiments above, however, it is to be understood that the scope of the present invention is not limited to the disclosed embodiments. On the contrary, it is intended to cover various modifications and similar changes. The scope of the claims, therefore, should be accorded the broadest interpretation so as to encompass all such modifications and similar arrangements.

What is claimed is:

1. A circuit board structure with optoelectronic component embedded therein, comprising:
   a carrier board with at least two through openings;
   a first optoelectronic component and a second optoelectronic component disposed in the openings of the carrier board respectively, wherein both the first optoelectronic component and the second optoelectronic component have an active surface and an opposing non-active surface, and the active surface of each optoelectronic component has a plurality of electrode pads and optical active areas;
   a dielectric layer formed on a surface of the carrier board and on the active surface of the first and second optoelectronic components, wherein a plurality of vias for exposing the electrode pads of the first and second optoelectronic components and two holes for exposing the optical active areas of the first and second optoelectronic components are formed in the dielectric layer;
   a circuit layer formed on a surface of the dielectric layer, wherein the circuit layer is electrically connected to the electrode pads of the first and second optoelectronic components by an electrically conductive structure formed in the vias of the dielectric layer;
   an insulating protecting layer formed on the surface of the dielectric layer and the circuit layer, wherein holes from exposing the optical active areas of the first and second oiptical components are formed in the insulating protecting layer and corresponding to the holes of the dielectric layer; and
   at least one optical transmission element formed on a surface of the circuit insulating protecting layer, wherein the optical transmission element has at least one terminal located at the top of one of the holes of the insulating protecting layer.

2. The circuit board structure with optoelectronic component embedded therein of claim 1, further comprising: another carrier board formed on an opposing surface of the carrier board that is not formed with the dielectric layer.

3. The circuit board structure with optoelectronic component embedded therein of claim 1, wherein the carrier board is one of a metal board, a ceramic board, an insulating board or an organic circuit board.

4. The circuit board structure with optoelectronic component embedded therein of claim 1, wherein the carrier board is a stack structure composed of a metal board, a ceramic board, an insulating board or an organic circuit board.

5. The circuit board structure with optoelectronic component embedded therein of claim 2, wherein another carrier board is one of a metal board, a ceramic board, an insulating board or an organic circuit board.

6. The circuit board structure with optoelectronic component embedded therein of claim 2, wherein another carrier board is a stack structure composed of a metal board, a ceramic board, an insulating board or an organic circuit board.

7. The circuit board structure with optoelectronic component embedded therein of claim 1, further comprising: a circuit build-up structure formed on the surface of the dielectric layer and the surface of the circuit layer, wherein holes are formed in the circuit build-up structure at a position corresponding to the holes of the dielectric layer to expose the optical active areas of the first and second optoelectronic components respectively.

8. The circuit board structure with optoelectronic component embedded therein of claim 7, wherein the circuit build-up structure comprises at least one dielectric layer, a circuit layer disposing on the dielectric layer, and an electrically conductive structure formed in the dielectric layer.

9. The circuit board structure with optoelectronic component embedded therein of claim 7, further comprising: an insulating protecting layer formed on an outer surface of the circuit build-up structure, wherein the insulating protecting layer is formed with holes to expose the optical active areas of the first and second optoelectronic components.

10. The circuit board structure with optoelectronic component embedded therein of claim 1, further comprising: a protecting shield formed on the surface of the optical transmission element.

11. The circuit board structure with optoelectronic component embedded therein of claim 10, wherein the protecting shield is one of a metallic case or an encapsulant.

12. The circuit board structure with optoelectronic component embedded therein of claim 1, further comprising: a heatsink block disposed on the non-active surface of the first and second optoelectronic components.

13. The circuit board structure with optoelectronic component embedded therein of claim 1, wherein at least one terminal of the optical transmission element has a reflection surface.

14. The circuit board structure with optoelectronic component embedded therein of claim 1, wherein the optical transmission element is formed with a cladding layer formed on a surface of a core layer.

15. The circuit board structure with optoelectronic component embedded therein of claim 14, wherein the cladding layer of the optical transmission element is formed on the surface of the dielectric layer and the surface of the circuit layer, and a terminal of the optical transmission element is located at the top of the holes of the dielectric layer to correspond to the optical active areas of the first and second optoelectronic components.

16. The circuit board structure with optoelectronic component embedded therein of claim 1, wherein the first optoelectronic component is one of an optical active component or an optical passive component.

17. The circuit board structure with optoelectronic component embedded therein of claim 1, wherein the second optoelectronic component is one of an optical active component or an optical passive component opposing to the first optoelectronic component.

18. The circuit board structure with optoelectronic component embedded therein of claim 1, further comprising at least one semiconductor component disposed in the openings of the carrier board, wherein the semiconductor component has an active surface and an opposing non-active surface, and the active surface of the semiconductor component has a plurality of electrode pads for electrically connecting to the electrically conductive structure of the circuit layer.

19. The circuit board structure with optoelectronic component embedded therein of claim 18, further comprising: a heatsink block disposed on the non-active surface of the semiconductor component.

20. The circuit board structure with optoelectronic component embedded therein of claim 1, wherein the holes penetrating through the dielectric layer and the insulating protecting layer are filled up with a light guiding material or vacuumed.

21. The circuit board structure with optoelectronic component embedded therein of claim 9, wherein the holes penetrating through the dielectric layer, the circuit build-up structure and the insulating protecting layer are filled up with a light guiding material or vacuumed.

22. The circuit board structure with optoelectronic component embedded therein of claim 15, wherein the holes penetrating through the dielectric layer are filled up with a light guiding material or vacuumed.

* * * * *